United States Patent [19]
Edwards

[11] Patent Number: 6,042,623
[45] Date of Patent: Mar. 28, 2000

[54] TWO-WAFER LOADLOCK WAFER PROCESSING APPARATUS AND LOADING AND UNLOADING METHOD THEREFOR

[75] Inventor: Richard C. Edwards, Wesley Hills, N.Y.

[73] Assignee: Tokyo Electron Limited, Japan

[21] Appl. No.: 09/005,862

[22] Filed: Jan. 12, 1998

[51] Int. Cl.[7] .......................... H01L 21/00; C25B 13/00
[52] U.S. Cl. ................... 29/25.01; 438/908; 204/298.26
[58] Field of Search ........................ 204/298.25, 298.26, 204/298.35; 438/908; 29/25.01

[56] References Cited

U.S. PATENT DOCUMENTS

| | | |
|---|---|---|
| 4,816,638 | 3/1989 | Ukai et al. . |
| 4,825,808 | 5/1989 | Takahashi et al. . |
| 4,917,556 | 4/1990 | Stark et al. . |
| 5,067,218 | 11/1991 | Williams . |
| 5,186,718 | 2/1993 | Tepman et al. . |
| 5,259,881 | 11/1993 | Edwards et al. . |
| 5,433,785 | 7/1995 | Saito . |
| 5,509,771 | 4/1996 | Hiroki . |
| 5,516,732 | 5/1996 | Flegal . |
| 5,520,002 | 5/1996 | Ishikawa . |
| 5,620,578 | 4/1997 | Hurwitt . |
| 5,638,687 | 6/1997 | Mizohata et al. . |

FOREIGN PATENT DOCUMENTS

| | | |
|---|---|---|
| 0608633 | 8/1994 | European Pat. Off. . |
| 0756316 | 1/1997 | European Pat. Off. . |
| 3-241853 | 10/1991 | Japan . |

*Primary Examiner*—David E. Graybill
*Attorney, Agent, or Firm*—Wood, Herron & Evans L.L.P.

[57] ABSTRACT

Wafers from plural non-vacuum multiple wafer carriers are loaded and unloaded in an atmospheric front end of a wafer processing machine and transferred to and from a high vacuum chamber of a transfer module of a wafer processing cluster tool, or back end, through a single two-wafer loadlock. Preferably, with the wafers oriented horizontally throughout, two wafers are sequentially loaded into and simultaneously moved inbound to the high vacuum back end of the system, through one loadlock and sequentially moved into and simultaneously moved outbound through the same loadlock, the loadlock having a pair of water cooled supports for simultaneously actively cooling the two wafers. In both the atmospheric front end and vacuum back end environments, transfer arms load and unload the loadlock, and transfer wafers within the environments when all loadlocks are sealed. Preferably, two wafers are actively cooled in the loadlock. Preferably also, wafers are passed through a wafer aligner after being removed from a carrier and before placed in the loadlock. When two wafers are removed from the loadlock into the vacuum back end, one or two wafers may be temporarily held in a buffer position within the back end vacuum chamber.

22 Claims, 5 Drawing Sheets

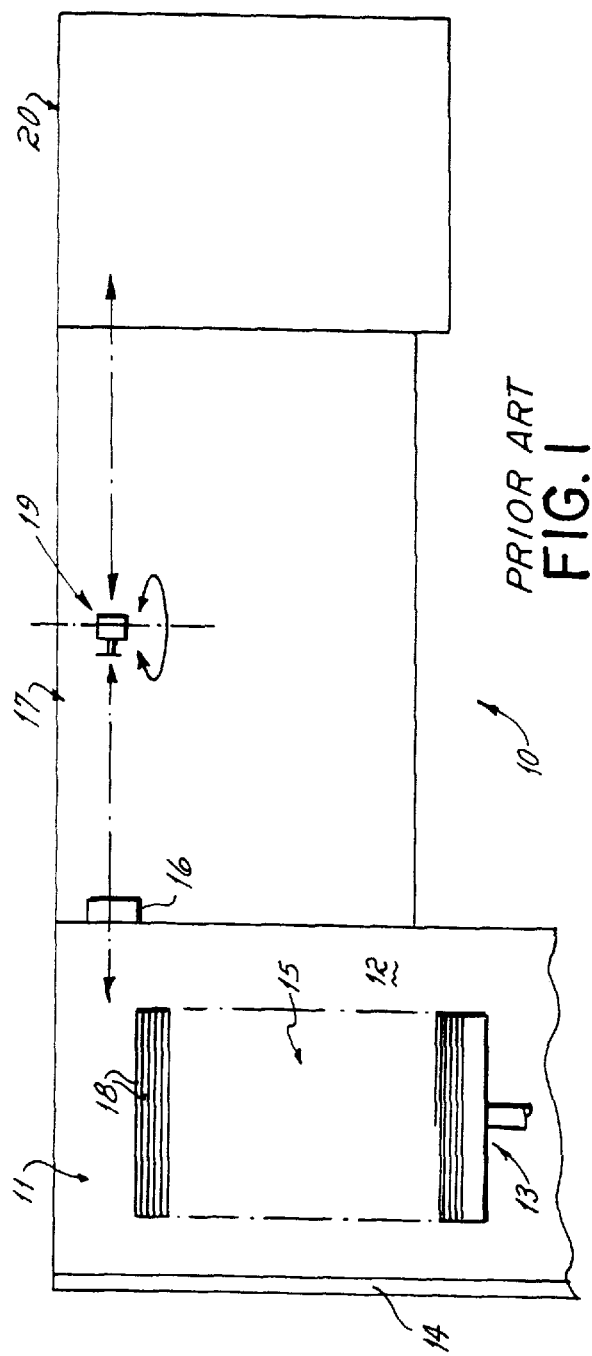
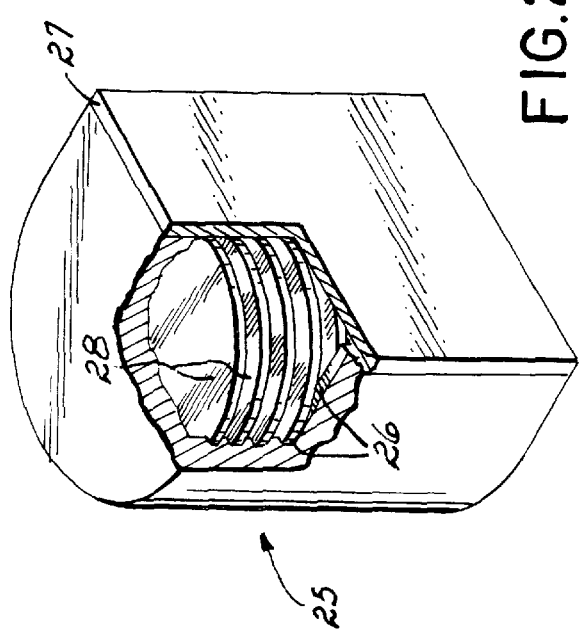

6,042,623

TWO-WAFER LOADLOCK WAFER PROCESSING APPARATUS AND LOADING AND UNLOADING METHOD THEREFOR

This application is related to the commonly assigned and copending U.S. patent application Ser. No. 08/853,172, filed May 8, 1997 and entitled "Multiple Single-wafer Loadlock Wafer Processing Apparatus and Loading and Unloading Method Therefor" of which the inventor hereof is an inventor, which is hereby expressly incorporated by reference herein.

FIELD OF THE INVENTION

This invention relates to the loading and unloading of wafer processing machines and particularly to transferring substrates from batches of large semiconductor substrates between atmospheric pressure and high vacuum environments.

BACKGROUND OF THE INVENTION

The vacuum processing of semiconductor wafers requires the loading and unloading of wafers into and from wafer processing equipment in a manner that does not cause adverse atmospheric contamination of the high vacuum environment or wafers within the processing apparatus. In addition, in order to maximize wafer throughput, it is desirable to minimize the time it takes for a typical loading or unloading sequence to be carried out. Furthermore, as wafer sizes continue to increase, as with the current trend from 150 mm and 200 mm diameter wafers to 300 mm diameter wafers, it becomes increasingly more difficult to simultaneously satisfy both contamination and throughput requirements, resulting in a compromise solution that is often far from ideal. Still further, as the wafer value increases, such as in the later stages of processing and with increasingly larger wafers that contain more devices as well as more complex devices, the exposure to financial loss due to wafer damage from an apparatus failure increases, forcing higher reliability requirements on the wafer transfer apparatus.

The majority of the prior art semiconductor wafer vacuum processing systems currently in use utilize what is referred to as a Vacuum Cassette Elevator (VCE) for wafer sizes up to 200 mm. An example of a VCE-equipped prior art wafer processing system 10 is diagrammatically illustrated in FIG. 1. The system 10 includes at least one VCE 11 which consists of a loadlock chamber 12 that can be pumped to high vacuum, an elevator assembly 13 located within the chamber 12, a front door 14 for operator access to load and unload a multiple-wafer cassette 15 when the chamber 12 is at atmospheric pressure, and a slit valve isolated interface port 16 that connects the VCE 11 to some form of wafer transfer module 17 for individually transferring wafers there through when the chamber 12 is at a high vacuum.

Typical operation of a processing apparatus 10 that is based on the use of a VCE 11 proceeds with an operator opening the door 14 of the VCE 11 and placing a new cassette 15 of wafers 18 on top of the elevator 13. The door 14 is then closed, followed by a pumping sequence with the slit valve of interface port 16 in a closed condition, which establishes an appropriate vacuum level in the VCE 11. The pumping time to arrive at a given vacuum pressure level is generally proportional to the volume of the VCE 11 and to the exposed inner surface area of the VCE 11 and of the wafers 18 contained therein. When the appropriate VCE vacuum level is reached, the isolating slit valve port 16 between the VCE 11 and vacuum transport chamber 17 is opened, permitting access to the VCE 11 by a robot arm 19 in the wafer transport module 17. The elevator 13 then positions the cassette 15 for access of the transfer arm 19 to a desired wafer 18 in the cassette 15. The robotic transfer arm 19 then extends into the VCE 11 through the slit valve port 16, captures the positioned wafer 18 and retracts back into the transport module 17 in preparation for delivery of the wafer 18 to an appropriate process module 20 of the apparatus 10. These steps are performed in reverse, with wafers being returned to a cassette 15 with the VCE 11 under vacuum, the slit valve closed and, instead of pumping the VCE 11, venting the VCE 11 to atmosphere.

The prior art apparatus 10 of FIG. 1 can be used for 300 mm wafers if open wafer cassettes of comparable size are also used. However, for a number of reasons, semiconductor device manufacturers who are the end users of the wafer processing equipment prefer, and are in the process of establishing a standard for, a type of wafer carrier that is not high vacuum compatible and does not use a removable cassette 15. Such a carrier 25 is illustrated in FIG. 2. The carrier 25 includes a vertical array of horizontal wafer supporting rails 26 built into the carrier 25, which may be standardized at twelve or thirteen equally spaced levels or at twenty-five or twenty-six equally spaced levels. The carrier 25 has a front door 27, which is normally closed during the transport of wafers 28 between different pieces of processing equipment.

Since the carrier 25 is not high vacuum compatible and contains no cassette or cassette elevator, wafers must be transferred at atmospheric pressure from the carrier 25 and into the wafer processing equipment. The straightforward method contemplated in the prior art is to transfer wafers 28 from the carrier 25 into a processing apparatus, such as machine 10 of FIG. 1. Where it is desired to place a full carrier 25, either of twelve or thirteen wafers or of twenty-five or twenty-six wafers, into a large VCE 11, one would have to devise a method for quickly moving wafers from the carrier 25 into the VCE 11. A single wafer serial transfer approach adds significant time to the loading and unloading cycles, and is therefore undesirable. A multiple wafer simultaneous transfer approach has been suggested in which wafers are transferred in one or two batches from the carrier 25 to the VCE 11. Such a parallel transfer approach, however, presents risk of multiple wafer damage due to a single equipment failure, which is a risk preferably avoided. Also, the likelihood of mechanically touching the back side of a wafer that is positioned over another unprocessed wafer, which is difficult to avoid when wafers are transferred simultaneously, poses potential particulate contamination problems. In addition, with a VCE dimensioned to hold wafers that are 300 mm in diameter or larger, VCE pump-down and/or vent time can be unacceptably long, making the loadlock cycle a throughput-limiting factor in the operation of the processing apparatus. To compensate for these delays with a compromise of pump-down or vent time can result in an increase in atmospheric contamination of the transfer chamber or in particulate contamination on the wafer, or both.

With large diameter wafers, large high vacuum pumps are necessary to pump the large VCEs that the larger wafers require. Such large pumps are difficult to mechanically isolate from the VCEs, and as a result, such pumps have a tendency to transmit vibrations to the VCE that can cause particles to fall from one wafer onto another wafer below. Similarly, it is believed that the up and down motion of elevators in VCEs can also contribute to an increased vibration-induced fall of particles from upper wafers to lower wafers. Vibration can also cause wafers to move out of their positions in the cassettes and to be out of the position necessary for pick up by the transfer arms.

Accordingly, there remains a need for loading and unloading wafers into and from wafer processing equipment from a non-VCE carrier in a manner that does not cause adverse atmospheric contamination of the high vacuum environment or the particulate contamination of wafers within the wafer processing apparatus, and that does not limit wafer throughput of the equipment, particularly with large diameter wafers, such as those of 300 mm diameter or larger, and without increasing the risk of financial loss due to multiple wafer damage from an apparatus failure which would force higher reliability requirements to be placed on the wafer transfer apparatus.

SUMMARY OF THE INVENTION

It is a primary objective of the present invention to eliminate the need for large vacuum cassette elevator modules in semiconductor wafer processing machines and processes. It is a further objective of the present invention to significantly reduce the time required for the pumping and venting of loadlocks in semiconductor wafer processing machines, and particularly to prevent loadlocks from being a throughput-limiting factor.

It is a further objective of the present invention to reduce or avoid particulate contamination in the transfer of wafers into and out of processing machines. In particular, objectives of the present invention include the elimination of moving elevators, as well as the vibration associated therewith that causes particle contamination problems, the reduction in size of high vacuum pumps and in the vibration due to pump operation, and the avoidance of the need to use large high vacuum pumps.

It is a further objective of the present invention to provide improved wafer processing machine throughput, particularly for small batches of wafers, such as those used during wafer qualification. It is a particular objective of the present invention to reduce the possibility of the large VCEs and loadlocks becoming a throughput limiter for a wafer processing apparatus.

An additional objective of the present invention is to eliminate the need for simultaneous or parallel wafer handling, and particularly to thereby reduce the risk of damage to multiple wafers and the probability of particles falling on wafers.

A specific objective of the present invention is to provide that wafer throughput of a wafer processing machine is not impacted by wafer cooling and alignment.

It is another objective of the present invention to optimize the above objectives while providing an apparatus that is simple and economical, and which is efficiently packaged.

According to the principles of the present invention, a wafer processing cluster tool is provided having a transfer or transport module with a high vacuum transfer mechanism therein which connects through a loadlock with an atmospheric pressure front end module (AFE) that also has a transfer mechanism therein. Preferably, a single loadlock is used, which is configured to hold two parallel vertically spaced and horizontally oriented wafers. The transfer mechanism in the transfer module moves wafers individually, between the loadlock and processing modules, which each connect through an isolation valve with the transfer module, as well as moves wafers among the processing modules, in a high vacuum environment. The transfer mechanism in the front end module moves individual wafers between the one or more loadlocks and a plurality of multi-wafer carriers in an atmospheric pressure environment. Either the AFE transfer arm or each carrier is vertically moveable to allow selected individual wafers to be loaded to or unloaded from the carrier by horizontal translation of the wafer by the transfer arm. The connection between the AFE and the transfer module is preferably made through one two-wafer loadlock, preferably of the over-under type, which may have either the vacuum pressure side or the atmospheric pressure side on the top.

According to the preferred embodiment of the invention, the AFE includes a wafer aligner and provision for connection to two or three multiple-wafer carriers. One loadlock is provided that is capable of being operated as an inbound loadlock to transfer wafers into the vacuum and as an outbound loadlock to transfer wafers out of the vacuum. A loadlock that is capable of operating as an outbound loadlock is also equipped with a cooling element to cool down the wafer, during the loadlock vent cycle, after the wafer has been processed, and before the wafer is loaded back into a carrier. The outbound loadlock, with such cooling elements, is capable of supporting hot wafers that are still at or near processing temperatures. Accordingly, such outbound loadlock is preferably provided with high temperature compatible wafer supporting elements of, for example, metal. More than one loadlock may be provided and each adapted for use for both inbound and outbound wafers for optimum throughput with each equipped with cooling capability to permit continued operation if one loadlock were to fail.

In an alternative embodiment of the invention, separate dedicated inbound and outbound loadlocks may be provided. In such a case, the dedicated inbound loadlocks need not be provided with cooling elements, which lowers their cost, and the supports for the substrates therein need not be capable of supporting wafers that are at high temperature. As a result, high friction elastomeric wafer support structure may be used to reduce the likelihood that a substrate supported thereon will be vibrated or jarred out of position, thereby permitting substrate movement at the loadlock to be carried out at higher speed. Similarly, because wafer alignment retention is not as critical with outbound wafers, a loadlock being used for outbound transfer of wafers can be operated at higher speed.

The AFE is also preferably maintained in a laminar flow environment. Preferably, the carriers are loaded in a room environment from which they are transferred to adjacent the AFE portion of the apparatus. Such carriers are preferably secured on structure that present the carrier with a carrier door facing an opening to an inner AFE chamber, in a proper position and orientation for access to the wafers therein by the AFE transfer arm when the carrier access door is open. When so positioned and oriented, a mechanism in the AFE operates the door on the carrier to allow the access by the AFE transfer arm. When a carrier door is open, a laminar and preferably horizontal flow of clean air or other gas is maintained in the AFE to flow particles and gas away from the loadlocks and away from the carriers.

In accordance with the present invention, carriers are moved into position adjacent the opening to the AFE chamber while laminar flow of air is maintained in the AFE chamber. A carrier door is opened and a wafer, preferably the bottommost unprocessed wafer, is picked by the AFE transfer arm from the opened carrier and placed in the loadlock, which is open to the AFE chamber and sealed from the high vacuum chamber of the apparatus. The wafer placed in the loadlock is set on the tops of raised lift pins, preferably on an upper one of two sets of pins, and the transfer arm is withdrawn from the loadlock chamber. Then a second wafer is removed from a carrier, preferably from the next higher position in the carrier, and placed in the loadlock on the tops of a second set of raised lift pins, preferably on a lower one of the sets of pins, and the transfer arm is withdrawn from the loadlock chamber. Then the loadlock chamber is sealed from the AFE chamber, and the loadlock is pumped to a vacuum level that is compatible with the high vacuum level of the high vacuum transfer chamber. While the loadlock chamber is being pumped, the AFE transfer arm may remove another wafer from the same carrier, or another carrier if provided, and hold the wafer in a position ready to be placed in a loadlock chamber, or the AFE transfer arm may use the pump down time to remove a wafer from another loadlock, if provided, and place it in a carrier.

When the loadlock containing an inbound unprocessed wafer has been pumped to the appropriate vacuum, the loadlock is opened to the high vacuum transfer chamber while a wafer on the lift pins, preferably the one on the lower set of pins, is moved vertically into a position to be removed from the loadlock and is then transferred into one of the processing chambers. Then, a processed wafer may be removed from a processing chamber and placed on the lower set of pins in the loadlock, and in most processes, throughput is optimized by doing so. Preferably also, a wafer on the other set of lift pins, preferably the one on the upper set of pins, is moved vertically into a position to be removed from the loadlock and is then transferred into one of the processing chambers. Then, another processed wafer may be removed from a processing chamber and placed on the upper set of pins in the loadlock, and in most processes, throughput is optimized by also doing so.

Ideally, one or two wafers are always passing inbound through a loadlock when a loadlock is being pumped, and one or two wafers are always passing outbound through a loadlock when a loadlock is being vented. Alternatively, one loadlock may be a dedicated inbound loadlock and another may be a dedicated outbound loadlock. In either event, when one or two outbound wafers are placed in a loadlock from the high vacuum back end, or HVBE, the loadlock is then closed from the high vacuum transfer chamber and vented to atmosphere.

When two wafers have been processed, the wafers may then each be transferred from their final processing chamber used in the process to a loadlock, with the processed wafers being sequentially placed by the transfer arm of the high vacuum transfer chamber, each onto one set of the pins, whereupon the transfer arm is withdrawn from the loadlock, followed by the wafer being moved vertically into a loadlock chamber for outbound transfer as the chamber is sealed from the high vacuum atmosphere. The pins in the support are then preferably lowered to set the wafer onto the support, whereupon, cooling tubes in the wafer support function to remove heat from the wafer and thereby cool the wafer to a temperature suitable for placing it in a carrier, since the carrier may not be compatible with temperatures that are as high as the temperature at which a wafer, which has just been processed, might be. The cooling rate and venting gas are selected to avoid contacting a hot wafer with air, which can degrade the film properties of the wafer.

When processed wafers have been cooled in a loadlock and the loadlock has been vented to the atmospheric pressure level of the AFE chamber, the loadlock is opened to the AFE chamber, the lift pins raise the wafers and the AFE transfer arm sequentially picks up the wafers and returns them, each to one of the carriers, preferably the one from which they were removed. The cycling of wafers from the carriers preferably includes the removal of the bottom wafer first, then each of the wafers sequentially from the bottom to the top of the carrier, as there is processing space for them in the high vacuum processing portion of the machine. The wafers, once processed, are returned to a carrier, typically in the same sequence in which they were removed, and placed in the same slot or position in the carrier from which they were removed. The carrier is thus refilled from the bottom to the top. A section of empty slots will thus be present in a carrier between the last wafer to be returned to the carrier, which is at the top of the partial stack of processed wafers extending from the bottom of the carrier, and the next unprocessed wafer to be removed for processing, which is at the bottom of the partial stack of unprocessed wafers that extends to the top of the carrier.

According to one embodiment of the invention, a buffer station is provided in the HVBE transport chamber to allow the loadlock to run with minimal waiting time as wafers are being loaded or unloaded to or from the loadlock. Such a buffer station may be in the form of a support within the HVBE transfer chamber, or a buffer chamber may be provided at one of the transfer chamber ports that is permanently open to the transfer chamber and maintained at the vacuum level of the HVBE transfer chamber.

According to certain aspects of the invention, wafers in the AFE are exchanged with carriers of unprocessed wafers while wafers of another carrier are being cycled by the AFE transfer arm to and from the loadlocks. In this case, structure may be optionally provided to restrict the flow of air between the portion of the AFE chamber being occupied by the carrier that is in use and the portion occupied by the carrier or carriers being changed.

In the preferred embodiment of the invention, wafers being loaded from a carrier to a loadlock pass through a wafer aligning station, which angularly orients a flat or other reference on the wafer relative to the transfer arm of the AFE. The aligner may also center the wafer on the transfer arm but, preferably, measures the off-center x-y distances so that transfer arm movement can be controlled to compensate for the off-center distances. Throughput is enhanced by locating the aligner in the AFE rather than in the high vacuum. During all handling of wafers referred to above, the wafers are preferably maintained in a horizontal orientation, with the device side thereof facing upward. Preferably also, most of the motion of wafers in the AFE, among the loadlocks, the aligner and the carriers, is carried out with edgewise motion of the wafers in a common plane, with only the wafer motion necessitated to select a wafer from and return a wafer to the proper position involving motion with a vertical component. Similarly, the motion of wafers between the loadlocks and the processing stations in the transfer chamber is carried out with edgewise motion of the wafers in a common plane. The planes of motion in the AFE and transfer chambers are preferably vertically spaced, with the motion between the vertically spaced planes taking place by transfer of the wafer through a loadlock, which is preferably exclusively by vertical motion. The transfer arms also undergo a slight vertical motion when placing a wafer on or lifting a wafer from the support pins of a loadlock.

The present invention eliminates large VCEs and the long pump and vent times that are associated with them, particularly where they are designed for and contain large wafers. Accordingly, better throughput is achieved, particularly with small batches of wafers, and loadlock operation is not likely to be a throughput limiter. Particularly, time is made available for replacing a carrier with another carrier of wafers without adversely affecting machine throughput. No carrier movement occurs once the wafers are inserted in position to be loaded into the machine. The picking of one wafer from above another wafer, and the potential for the dropping of particles on the lower wafer that this creates, is avoided. The high vacuum pumps for loadlock pumping are reduced in size with the present invention, which reduces the cost, the cycle time, and potential vibration that can increase particulate contamination and unwanted vibration induced wafer movement within the carriers. Single wafer movement in and out of the carrier is provided using industry proven robot transfer devices. With the present invention, a standard atmospheric aligner can be used providing lower cost, less complicated handling and faster operation than with high vacuum aligners. Two or three carriers can be accommodated in the preferred embodiments of the invention. The two wafer over-under loadlocks may be easily equipped with the contamination avoidance features of U.S. Pat. Nos. 5,237,756 and 5,205,051, expressly incorporated herein by reference herein.

The apparatus of the invention provides simplicity of design, economy of cost and efficient use of space. Particularly, the cost of components associated with more than one loadlock can be eliminated by eliminating additional cryopumps and compressors. Additional valves, gauging and other machined parts are also reduced. The overall apparatus has an economy of operating components and is accordingly of high reliability. Further, a transfer port in the HVBE otherwise used for a second loadlock may be used for other purposes.

These and other objectives of the present invention will be readily apparent from the following detailed description of the present invention in which:

BRIEF DESCRIPTION OF THE DRAWINGS

FIG. 1 is an elevational cross-sectional diagram of a VCE equipped cluster tool of the prior art.

FIG. 2 is a perspective view of an industry proposed wafer carrier that is not high vacuum compatible and does not use a removable cassette.

DETAILED DESCRIPTION OF THE PREFERRED EMBODIMENTS

Figure 3:
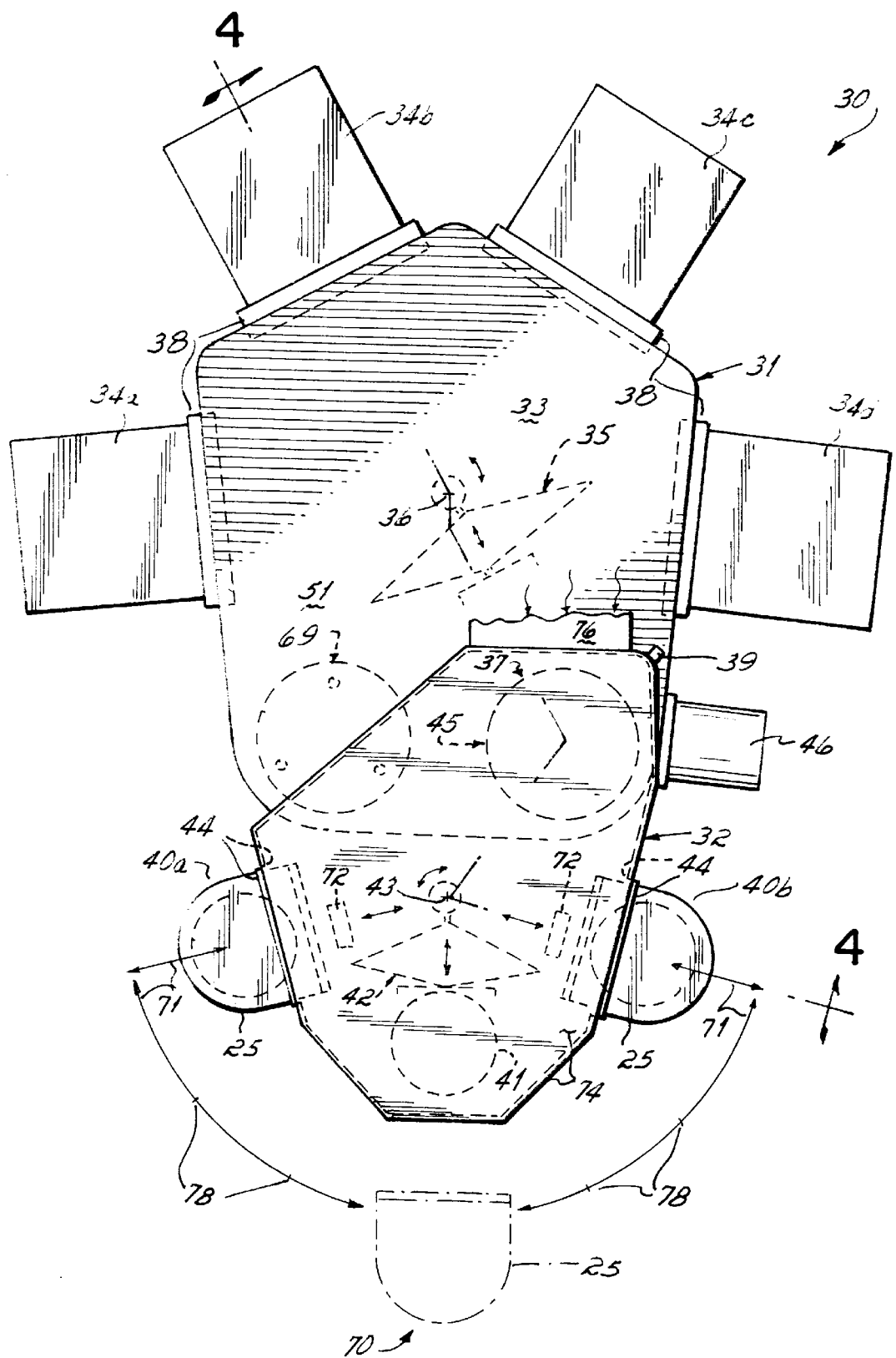
FIG. 3 is a top view diagram of a single, two-wafer loadlock equipped wafer processing apparatus according to one preferred embodiment of the present invention.

Referring to FIG. 3, one preferred embodiment of a semiconductor wafer processing apparatus 30 is diagrammatically illustrated. The apparatus 30 includes two basic parts, a high vacuum back end (HVBE) 31 and an atmospheric front end (AFE) 32. The HVBE 31 includes a transfer chamber 33 to which are connected a number of process chambers 34, illustrated as four modules 34a–34d, but which can include any number of modules including five or more such modules. The transfer chamber 33 has a pivotal and radially extendable wafer transfer arm 35 of a commercially available type, mounted therein for rotation about a vertical axis 36, which is capable of moving wafers individually among the processing modules 34 and to and from a single load lock station, but which may include more than one loadlock, and illustrated as including a single loadlock station 37 at which wafers are moved between the HVBE 31 and the AFE 32.

The HVBE 31, including the transfer chamber 33 and the processing chambers 34, contains a high vacuum during the operation of the processing apparatus 30, while the AFE 32 contains air or other gas, such as a dry inert gas, at an ambient or atmospheric pressure level. The processing chambers 34 each communicate with the transfer chamber 33 through a slit valve 38 that has the wafer transfer slit in the horizontal plane of the transfer arm 35 and through which the arm 35 moves wafers individually into and out of the processing chamber 34 from and to the transfer chamber 33 via the horizontal slit of the slit valve.

The AFE 32 includes a plurality of carrier support stations 40, each of which is capable of supporting a carrier 25 of the style having no separately removable cassettes, such as that illustrated in FIG. 2. The number of carrier stations is preferably two or three, with two such stations 40a and 40b being illustrated. The carrier stations 40 each accept either a batch of wafers in a vertical rack or carrier, preferably in the form of either the 300 mm carriers 25 or the conventional open wafer cassettes of the type that were typically used in VCEs (FIG. 1). The AFE 32 also includes a wafer aligner station 41 and a wafer transfer device robot, preferably in the form of an extendable wafer transfer arm 42 of a commercially available type, that pivots on a vertical axis 43. The arm 42 transfers individual wafers to and from the carriers 25 at the carrier stations 40a,40b, to and from the aligner station 41, and to and from the loadlock station 37. The aligner station 41 is equipped with a wafer aligner of any of several commercially available types, such as, for example, an optical aligner, that orients the wafer on the arm 42 and measures any off-center distance so that the machine controller can compensate for any such off-center distance with compensating transfer arm movements. The AFE 32 is provided with a sheet metal enclosure 74 that surrounds the transfer arm 42, the aligner station 41 and the atmospheric side of the loadlock station 37. In the enclosure 74 are a plurality of openings 44, one at each of the carrier stations 40a,40b. The openings 44 are shaped to allow the placement of the fronts of the carriers 25 in such a position that they substantially cover the openings with the carrier doors 27 thereof facing or projecting through the openings so that wafers located within a carrier 25 are accessible by the transfer arm 42 when the carrier door 27 is open.

In the illustrated embodiment of the apparatus 30, at least one carrier loading station 70 is provided in the user's clean room environment. The station 70 includes a platform or carriage (not shown) positioned to receive and present a carrier 25 respectively from and to an operator or robotic carrier handling device (not shown) for loading and unloading wafers to and from the apparatus 30. The platform or carriage of the loading station 70 should have carrier handling capabilities that will permit automatic movement of a carrier 25 between the loading station 70 and either one of the carrier stations 40a,40b.

Figure 4:
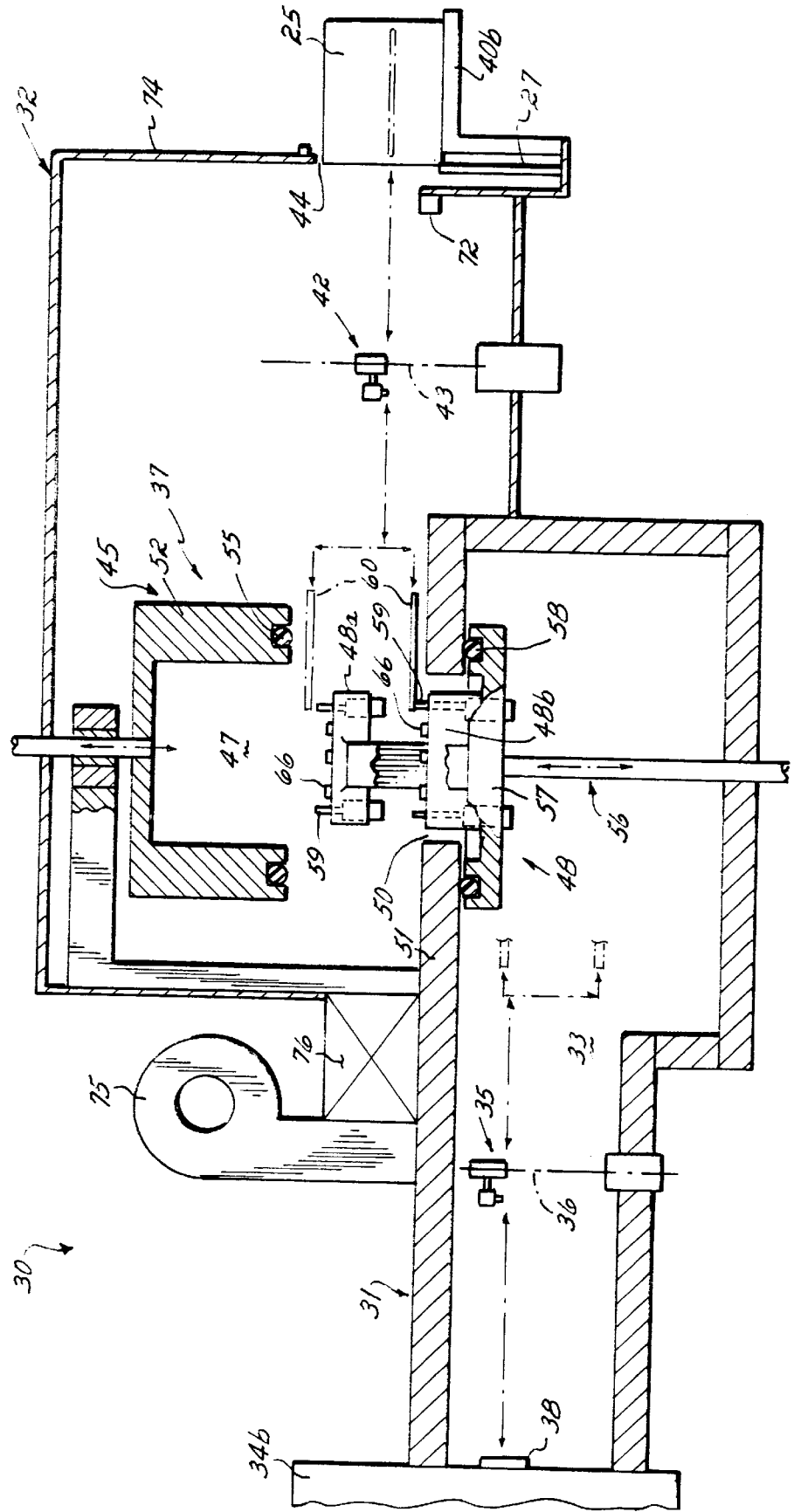
FIG. 4 is a cross sectional view along line 4—4 of FIG. 3 illustrating a single two-wafer loadlock in the open position.

As seen in FIG. 4, at the loadlock station 37, an independently operable, two-wafer loadlock 45 is provided, which is part of and built into an upper or lower horizontal wall of the HVBE 31. The loadlock 45 permits the passage of wafers, preferably two at a time, from the atmospheric environment of the AFE 32 to the high vacuum environment of the HVBE 31 while maintaining isolation between the two atmospheres. The loadlock 45 is provided with a high vacuum cryogenic pump 46 that is operable to pump the loadlock 45 to a fairly high vacuum pressure level, but not necessarily to the vacuum level of the HVBE 31. The loadlock pumping takes place with the loadlock 45 sealed (FIG. 4B) around a wafer being moved into the HVBE 31 from the AFE 32. The loadlock 45 is also each provided with vent valve structure 39, which is operable to vent the loadlock 45 at a controlled rate to atmospheric pressure with introduction of a gas that may be of the type present in the AFE 32, when the loadlock 45 is sealed around a wafer being moved into the AFE 32 from the HVBE 31.

The loadlock 45 encloses a sealable loadlock chamber 47 that has a volume limited to that necessary to contain two large horizontally oriented parallel wafers spaced vertically on a wafer transfer support 48, which includes an upper support 48a and a lower support 48b, as illustrated in more detail in FIG. 4. The vertical dimensions of the support, 48a,48b are exaggerated in the drawings to illustrate the details thereof, while in practice, the spacing and vertical dimensions of the two supports 48a,48b are made as small as practical to minimize the volume of the loadlock chamber 47.

The loadlock 45 is located at an opening 50 in a wall 51 of the transfer chamber 33, for example, the horizontal top wall, located between the transfer chamber 33 and the AFE 32. The loadlock 45 is provided with a vertically moveable downwardly-facing upper cup-shaped chamber cover 52 that moves downwardly against the upper wall 51 of the transfer chamber 33. The cover 52 is provided with an annular seal 55 around the perimeter of the bottom rim thereof to seal the loadlock chamber 45 from the atmospheric pressure environment within the AFE 32 by the selective downward activation of the cover 52. The cover 52 is raised upwardly to allow transfer of a wafer into or out of the loadlock 45 by the AFE transfer arm 42.

Similarly, on the bottom side of the wall 51 beneath the opening 50 is provided a vertically moveable wafer elevator 56, which includes the wafer supports 48a, 48b in an upwardly facing orientation, and an upwardly-facing cup-shaped closure panel 57. The closure panel 57 is provided with an annular seal 58 around the perimeter of the upper rim thereof to seal the loadlock chamber 47 from the low pressure environment within the HVBE 31 by the selective upward movement of the closure panel 57. The closure panel 57 is raised upwardly to allow transfer of a wafer by the HVBE transfer arm 35 into or out of the loadlock 45.

The wafer supports 48a, 48b each preferably include an array of lift pins 59. The pins 59 of each support 48a, 48b can be selectively lowered and raised in synchronism to move a wafer to or from the surface of the supports 48a, 48b. Normally, the pins 59 are in a raised position to facilitate a handoff of a wafer between the transfer arms 35 and 42 and the support level 48a, 48b. For such a handoff, the transfer arms 35 and 42 shift a gripped wafer vertically between a plane defined by the tops of the raised pins and a slightly higher horizontal plane in which the wafer is horizontally moved into and out of the loadlock chamber 47. In the two way loadlock illustrated, the pins 59 are made of a high temperature tolerant material such as a metal. Where a loadlock is a dedicated inbound loadlock, the pins need not have the capability of lowering a wafer to a cooling platform and may therefore be fixed pins on the support 48. In a multiple loadlock embodiment containing both an inbound and an outbound loadlock, the pins 59 in a dedicated inbound loadlock need not be of a heat tolerant material and are, therefore, preferably made of a high friction material that will permit faster operation of the platform without movement of the wafer thereon.

Figure 4A:
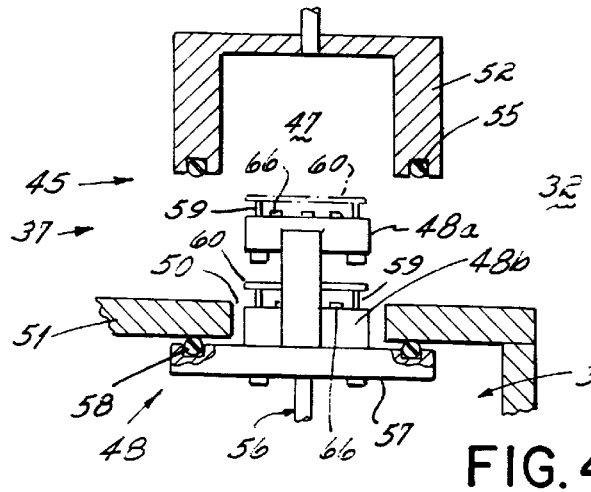
FIGS. 4A, 4B and 4C are sequential views of the loadlock of FIG. 4 illustrating the passage of a wafer therethrough from the atmospheric environment to the high vacuum environment.

In the operation of the loadlock 45 in a loading process (that is, a process which moves a wafer into the HVBE 31 for further transfer and processing in the vacuum environment), before transfer of a wafer from the AFE 32 into the loadlock station 37 for transfer into the HVBE 31, the loadlock 45 will have been vented to the atmosphere of the AFE 32 and the cover 52 will have been raised, opening the loadlock 45 to the inside of the AFE chamber 32, as illustrated in FIG. 4. In this state, the closure panel 57 will have been raised to seal the loadlock 45 from the high vacuum atmosphere of the HVBE 31. With pins 59 raised, the AFE transfer arm 42 extends to center a wafer 60 in the loadlock chamber 47 in the horizontal plane of the transfer arm 42, above the planes of the tips of the raised pins 59 on one of the support levels 48a, 48b, and of the upper wall 51 of the transfer chamber 33. When wafer 60 is centered in the loadlock chamber 47, the arm 42 lowers slightly toward one of the supports 48a,48b, preferably the upper support 48a first, to set a wafer 60 on the pins 59. Preferably, a second wafer 60 is then similarly placed on the pins 59 of the lower support 48b, as illustrated in FIG. 4A.

Figure 4B:
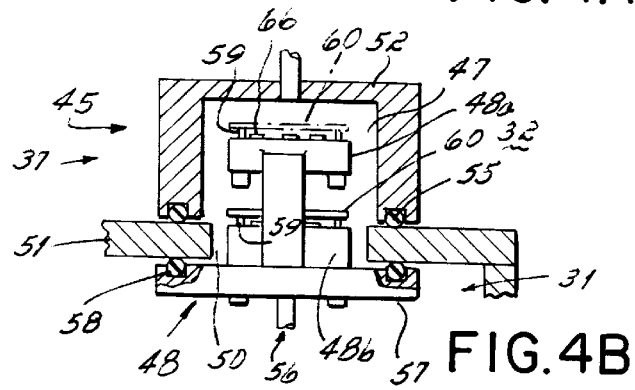
Figure 4C:
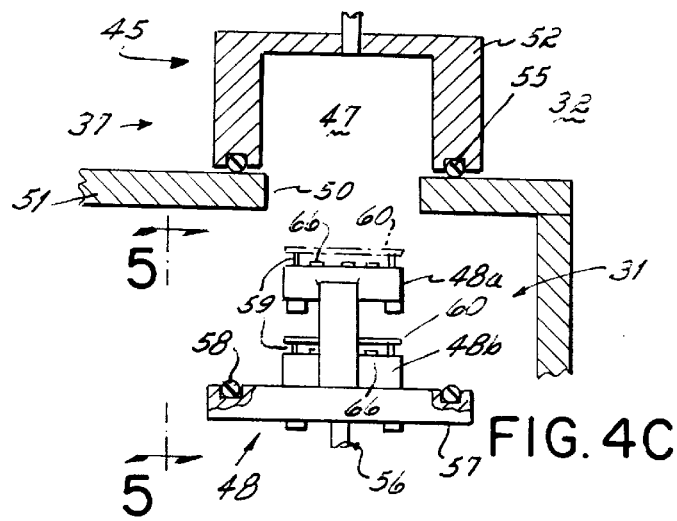
Figure 5:
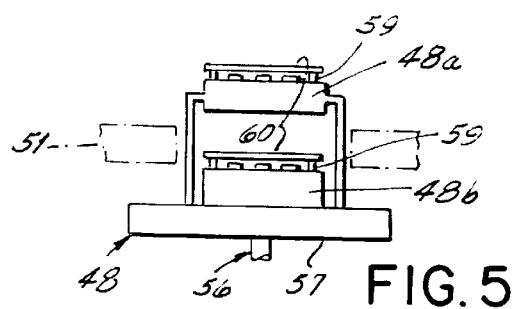
FIG. 5 is a view taken along line 5—5 of FIG. 4C.

Then, as illustrated in FIG. 4B, with the arm 42 retracted, the cover 52 is lowered in place, and the small volume of the chamber 47 is evacuated by operation of the pump 46. When the loadlock evacuation cycle is complete, the bottom elevator unit 56 is lowered into the high vacuum of the transfer chamber 33, sealing the opening 50 with cover 52, where the wafer 60 is removed by the movement of the HVBE transfer arm 35 into engagement with the wafer 60 and the lifting of the wafer 60 off of the pins 59, as illustrated in FIG. 4C. The wafers 60 at the two supports 48a,48b of the support 48 are preferably removed successively by the arm 35 of the HVBE 31, preferably with the lower wafer 60 on support 48b being removed first to reduce the likelihood of particles dropping on its surface from the upper wafer. The first wafer 60 to be removed from the loadlock 45 may be temporarily stored at a holding or buffer station 69 (FIG. 3) within the vacuum chamber 33 of the HVBE 31. The holding station 69 may include multiple supports to hold one, both or more wafers 60 that are removed from the loadlock 45 into the vacuum chamber 33, and may also include supports for processed wafers awaiting loading into the loadlock 45 or movement to another station such as a processing station 34.

After wafers are transported by the robot arm 35 to and from the vacuum process chamber 34a–d where they are processed, a reversal of the loading process described above allows a processed wafer 60 to be returned to its original spot in the AFE 32. The operation of the loadlock 45 in an unloading process (that is, a process which moves one or two wafers, for example, from the HVBE 31 after processing in the vacuum environment of a process chamber 34 and into the AFE 32 for return to a carrier 25), begins with the loadlock 45 evacuated to the vacuum pressure of the transfer chamber 33, the cover 52 lowered to seal the loadlock chamber 47 from the atmospheric environment of the AFE 32, and the closure panel 57 lowered to open the loadlock 45 to the inside of transfer chamber 33 of the HVBE 31. This may be a condition of the loadlock 45 after transfer of wafers into the vacuum chamber 33 of the HVBE 31. With the pins 59 raised, the HVBE transfer arm 35 extends to center wafer 60 in the loadlock chamber 47 in the horizontal plane of the transfer arm 35, above one of the supports 48a,48b, as illustrated in FIG. 4C.

Then, the arm 35 lowers slightly to set the wafer 60 on the tips of the pins 59, whereupon the wafer 60 is released by the arm 35 and the arm 35 is withdrawn from the loadlock chamber 47. Preferably, two wafers are loaded successively into the loadlock 45, one to each of the supports 48a,48b. The elevator 56 is then raised until the closure panel 57 seals the loadlock chamber 47 from the vacuum atmosphere of the transfer chamber 33, as illustrated in FIG. 4B. Then, the small volume of the chamber 47 is vented by controlled operation of the valve 39 to the atmospheric environment of the AFE 32. When the venting cycle is complete, the cover 52 is raised and the wafer 60 is removed by the movement of the AFE transfer arm 42 under a wafer 60, as illustrated in FIG. 4A, and the lifting of the wafer 60 from the pins 59 by the transfer arm 42 as illustrated in FIG. 4.

It is desirable to provide cooling of a wafer 60 after processing in the HVBE 31, and prior to exposure of the wafer 60 to ambient atmosphere external to the AFE 32. This cooling need be provided by only one loadlock station if more than one are provided. With a single two-wafer loadlock 37, cooling is provided on each support 48a,48b in the illustrated single loadlock embodiment. Preferably, the loadlock 45 is equipped with cooling capability which is effective to cool a wafer during the time it takes to vent an outward bound loadlock at station 37 so there is no throughput loss due to the cooling. To achieve this, the upper surfaces of the support 48 at both supports 48a,48b are cooled by the provision of a water cooled wafer support plate on its upper surface, which is preferably designed with a plurality of, for example, three or more small elevated areas 66, which actually support the wafer 60 when the pins 59 that have been holding the wafer 60 have been lowered into the supports 48a or 48b. Cooling ports may be provided in each support 48a,48b of the support, or the support may be provided with thermally conductive plates connected together or otherwise to a water ported or otherwise actively cooled or temperature controlled heat sink. The height of the elevated areas 66 is chosen to avoid heat transfer by direct conduction and to thereby slow the cooling rate down to avoid undesirable wafer warpage that might otherwise occur, since preferably no physical clamping of the wafer is provided. Pressure control of the gas within the loadlock 45 in order to regulate the cooling rate is avoided as that would defeat the objective of being able to vent the loadlock in a time frame that maximizes wafer throughput.

The use of a single two-wafer loadlock 45 in combination with batch carriers 25 permits the overall volume and total exposed surface area to be reduced to a small fraction of what is found in a loadlock sized for and containing a full cassette of wafers, as in FIG. 1, while minimizing the cost and maintaining a simple and reliable efficiently packaged configuration. The use of a single two-wafer loadlock 45 in place of full cassette loadlocks significantly reduces the time required to move small batches of wafers, for example qualification wafers, into and out of the apparatus 30. Further, during venting and pumping sequences, a two-wafer loadlock 45 allows use of the contamination prevention features described in U.S. Pat. Nos. 5,205,051 and 5,237,756, hereby expressly incorporated herein by reference, to reduce contamination due to either particulate or moisture condensation.

The loading of the machine 30 may be carried out by an operator, but is preferably carried out by a robot, which places a carrier 25 that is loaded with a plurality of unprocessed wafers, for example, a full standard batch of, for example twelve or thirteen, or of twenty-five or twenty-six, 300 mm wafers, in position at the loading station 70 of the AFE 32, as illustrated in FIGS. 3 and 4. Then a transfer mechanism (not shown but represented by arrows 71), move the carrier 25 from the loading station 70 to one of the carrier stations 40, for example, station 40a, with the door 27 of the carrier 25 locked and facing the axis of the AFE transfer arm 42 through one of the openings 44. So positioned, the carrier 25 is engaged by a locking and unlocking mechanism 72 within the AFE 32 that mechanically interacts with the carrier 25 to automatically unlock the door 27 as the carrier 25 is placed in position. Then, the mechanism 72 moves the carrier door 27 away from the carrier 25 and then down, thereby opening the carrier 25 and exposing a selected wafer to transfer arm 42. In this condition, the carrier 25 occupies one of the openings 44 in wall 74 in the AFE 32 to loosely isolate the inside of the AFE 32 from the clean room environment, thereby allowing for relaxation of the clean room standards and providing further particulate isolation within the AFE 32. Preferably, the arm 42 is first positioned vertically adjacent the lowermost position of the carrier 25 so that the bottom wafer in the carrier 25 is first picked up by the wafer transfer arm 42 for transfer. In this way, particles in the carrier 25 that are dislodged by the removal of a wafer from the carrier 25 will not fall on the upwardly facing surface of an unprocessed wafer where they could cause defects in processing.

When the arm 42 is properly positioned adjacent the carrier 25 for the removal of the first wafer, preferably from the bottom of the stack of wafers in the carrier 25, the transfer arm 42 picks the wafer from the carrier 25, moves it to the aligning station 41 where any off center distance of the wafer is measured so the wafer can be properly oriented by the transfer arm 42. The arm 42 then deposits the wafer on a support level 48a,48b in loadlock 37, compensating for any measured off-center distance. Once in the loadlock 45, a wafer 60, or preferably a pair of wafers 60, is moved from the AFE 32 into the HVBE 31 in the manner described above. The arm 42 indexes vertically to bring it in to alignment with the next lowermost wafer to be picked up on the next return of the transfer arm 42 to the carrier station 40a.

After wafers have been removed from the loadlock 45 at the loadlock station 37 and cycled through the processing stations 34 by the transfer arm 35 of the transfer chamber 33, the arm 35 places wafers preferably in loadlock 45 when it is already open to the chamber 33. After passing through the loadlock 45, the wafers preferably are moved by the AFE transfer arm 42, preferably back to the same position in the same carrier 25 from which the wafer was removed, for example, back into the carrier 25 at the carrier station 40a. In moving from a loadlock station 37 to a carrier 25, the aligner station is usually bypassed. However, having the aligner in the front end allows for wafer realignment prior to insertion into the carrier, should that be desired, without impacting back end processing in the HVBE 31. This outbound wafer alignment capability may be desirable if a wafer becomes misaligned during the cooling and loadlock vent cycle to the point where it might drag along the inside walls of the wafer carrier 25, which could increase particle problems. When all of the wafers in the carrier 25 at the carrier station 40 have been processed, the door 27 on the carrier 25 is closed and the locking and unlocking mechanism 72 is disengaged. Then, the carrier 25 is moved to the loading station 70 from which it may be removed by an operator or robot.

During the loading and unloading of wafers to and from a carrier 25 at a carrier station 40, a carrier 25 can be removed from the other station 40 and replaced with another carrier 25 of wafers to be cycled through the HVBE 31. During this and all operations within the AFE chamber, particulate contamination risk is reduced by a laminar flow of filtered air that preferably moves horizontally in a transverse direction in the AFE 32. Any structure (represented diagrammatically as a blower 75 and a filter 76) that is effective to produce the laminar flow that will produce results satisfactory to one skilled in the art is acceptable.

The front end configuration of the AFE 32 outlined above easily allows for the addition of a third wafer carrier station 40, if necessary, for example at the position occupied by the wafer aligner, which can be relocated.

Advantages of the preferred configuration of the loadlocks 45 are most effectively realized by configuring the loadlock 45 to have as small a volume as practical, preferably not more than about six to eight liters and preferably only about 4.5 to 5 liters. The volume of the loadlock chamber 47, is exaggerated in FIGS. 4–4C, as the lower surface of the chamber cover 52 may be shaped to lie within 20 to 30 thousands of an inch from a wafer supported on the pins 59, when elevated. Similarly, the height of the pins 59 in their elevated positions is also exaggerated in the figures, and need be only enough to allow for transfer to and from the transfer arms 35 and 42 and clearance with the raised surfaces 66 during transfer. Also, the thicknesses and spacing of the supports 48a,48b are shown to be greater than they preferably are. The upper support surfaces of the supports 48a,48b may be approximately one inch apart. The pins 59 may be ganged together and have inwardly projecting tabs so that they can simultaneously lift two wafers.

Preferably, the chamber 47 is flat, that is, has a low vertical profile, and is round, in plan view, or at least nearly round, to minimize wasted volume, thereby making higher speed pumping and venting more easily achievable. In addition, the vertical transfer direction of the loadlocks 45 in the preferred over and under configuration yields a more robust low volume lock structure. With such a configuration, the lock can be machined in a structural wall of the HVBE 31 so that the mounting and connecting of vacuum pumps to the loadlocks 45 results in minimal vibration. Avoiding the location of time or space consuming processes in the loadlocks 45, such as preheating and degassing processes, avoids making the loadlocks throughput-limiting. The over-under version provides the low vibration while maintaining a small footprint.

The single loading station 70 that is illustrated in FIG. 3 facilitates the design and use of a carrier delivery system by the user with which carriers 25 are delivered and taken from the loading station 70, or pre-arranged tracks. In addition, one or more buffer positions 78 may be established along the paths illustrated by the arrows 71 in which to temporarily park one or more carriers 25, such as incoming carriers of unprocessed wafers. This facilitates the exchange of carriers 25 between the machine 10 and a single carrier handler at the station 70. For example, with a carrier 25 at each of the stations 40a and 40b, a carrier 25 of unprocessed wafers can be delivered to loading station 70, then moved toward station 40a, where it can be parked at a position along the arcuate path of the arrows 71, to the left of station 70 in the figure. Then the carrier 25 can be transferred from the station 40b to the station 70 where it is removed by the robot, whereupon the incoming carrier parked to the left of the station 70 can be transferred to the location 40b. Other combinations of movements can be provided with additional buffer stations 78.

Figure 6:
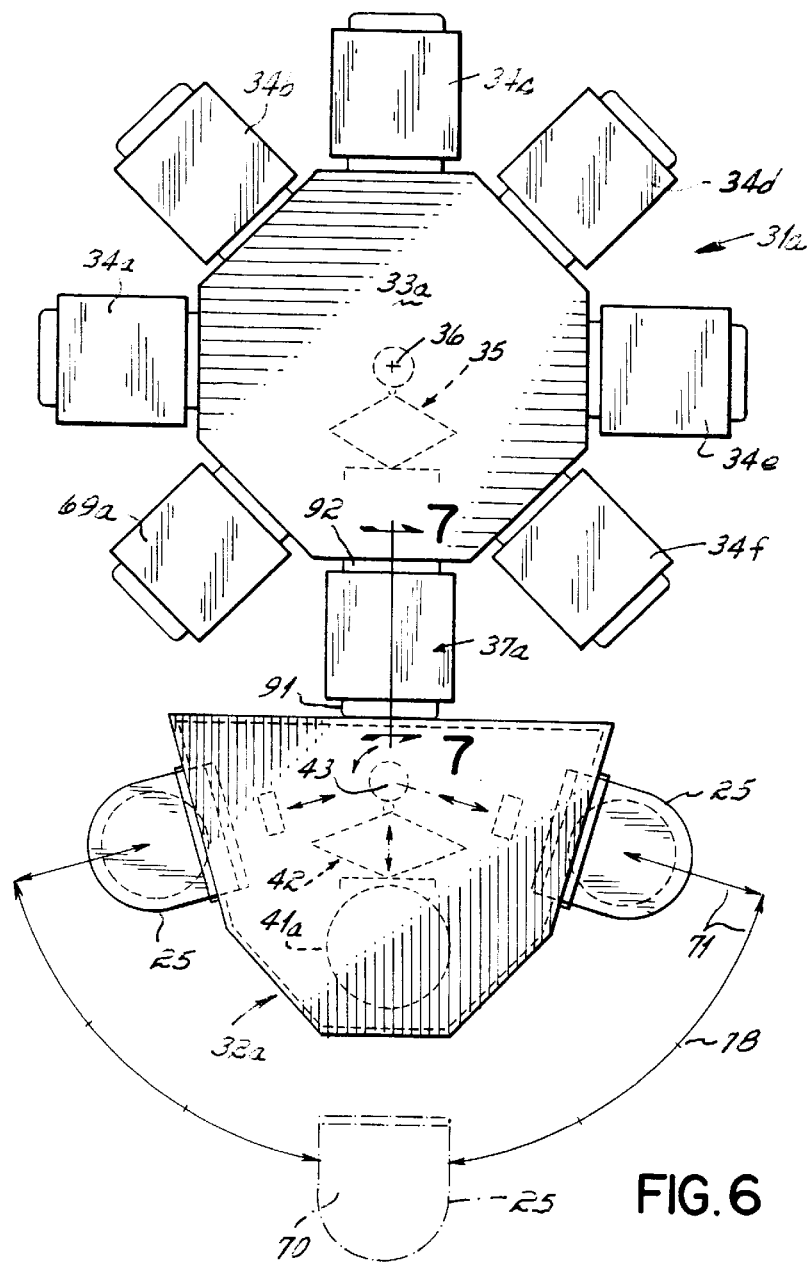
FIG. 6 is a top view, similar to FIG. 3, but of an alternative embodiment of the invention.
Figure 7:
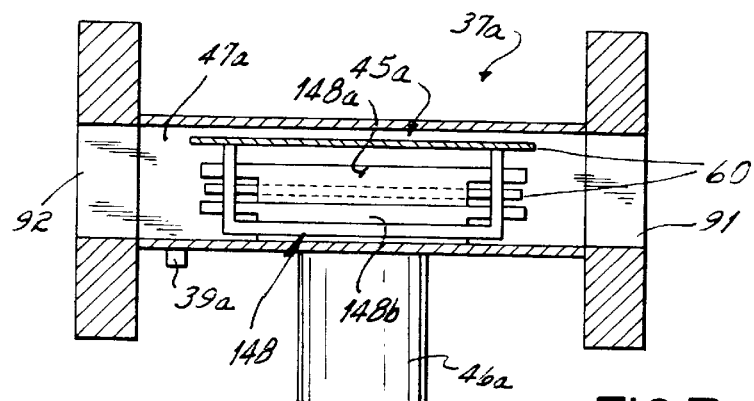
FIG. 7 is a cross sectional view taken along line 7—7 of FIG. 6.

The above described features, objectives and advantages are realized by the alternative embodiment of the invention illustrated in FIGS. 6 and 7 in which an alternative version of an HVBE 31a is provided in combination with an alternative version of an AFE 32a, which are interconnected through a horizontal pass-through slit-valve equipped loadlock 37a. The HVBE 31a includes a transfer chamber 33a to which is connected a number of process chambers 34, illustrated as six modules 34a–34f, as well as a buffer or holding station 69a. The module 34a may be, for example, an inductively coupled plasma etch module, while modules 34b–34e may be deposition modules. Module 34f may, for example, be a degas module. The holding station 69a may be, for example, a two position operating buffer without an isolation valve such that the chamber therein will be an extension of, and at the same pressure and atmosphere as, the transfer chamber 33a. The transfer chamber 33a also has therein a pivotal and extendable wafer transfer arm 35 mounted therein on vertical axis 36 for moving wafers individually among the processing modules 34 and to and from the load lock station 37a.

The loadlock station 37a is equipped with a loadlock 45a having a low volume loadlock chamber 47a therein. The chamber 47a communicates with the atmosphere of the AFE 32a and the vacuum of the HVBE 31a, respectively, through conventional slit valves 91 and 92. The loadlock 45a is provided with a vacuum pump 46a and atmospheric vent port 39a, which function as do the elements 46 and 39 of the embodiment of FIG. 3. In the chamber 47a of the loadlock 45a is provided a two level support 148 having a pair of vertically spaced supports 148a and 148b on which two wafers 60 can be placed for pumping or venting to respective vacuum or atmospheric conditions for transfer respectively from the AFE 32a to the HVBE 31a or from the HVBE 31a to the AVE 32a, according to an operational sequence that parallels that of the embodiment of FIG. 3 discussed above. The supports 148a,148b both preferably include lift pins (not shown) or other elevating structure for moving the wafers away from, or into contact with, cooling elements (not shown) in the supports 148a,148b.

Other embodiments in addition to the two discussed in detail above can be made. Those skilled in the art will appreciate that the applications of the present invention herein are varied, and that the invention has been primarily described in preferred embodiments. Accordingly, additions and modifications can be made without departing from the principles of the invention.

What is claimed is:

1. A method of transferring wafers between multi-wafer carriers and a high vacuum environment of a transfer chamber of a wafer processing cluster tool, the method comprising the steps of:

positioning a first multi-wafer carrier in communication with a clean atmospheric environment adjacent to a robot transfer device that is located in an atmospheric front end of the tool; then successively transferring a first and a second wafer with the robot transfer device from the first carrier and into a two-wafer loadlock, operating as an inbound loadlock, that is open to the atmospheric environment and sealed from the high vacuum environment of the transfer chamber; then sealing the loadlock from the atmospheric environment; then pumping the loadlock to a vacuum pressure level; then opening the loadlock to the high vacuum environment of the transfer chamber; then successively removing the first and second wafers from the loadlock with a transfer arm located in the transfer chamber and placing the first and second wafers into one or more vacuum processing chambers when such chambers are in communication with the high vacuum environment; and successively removing the first and second wafers, with the transfer arm located in the transfer chambers, from one or more vacuum processing chambers when such chambers are in communication with the high vacuum environment of the transfer chamber and placing the first and second wafers into a two-wafer loadlock, operating as an outbound loadlock, that is open to the high vacuum environment and sealed from the atmospheric environment of the front end of the tool; then sealing the outbound loadlock from the high vacuum environment of the transfer chamber; then venting the outbound loadlock to a pressure level of the atmospheric environment of the front end of the tool; then opening the outbound loadlock to the atmospheric environment of the front end; then successively transferring the first and second wafers from the outbound loadlock to a carrier.

2. The method of claim 1 wherein:

the two-wafer loadlock serving as an outbound loadlock is the same loadlock serving as the inbound loadlock; and the steps of placing the first and second wafers into the two-wafer loadlock, sealing the outbound loadlock, venting the outbound loadlock, opening the outbound loadlock and transferring the first and second wafers from the outbound loadlock include the steps of so placing the wafers into, sealing, venting, opening and transferring the wafers from the same loadlock used as the inbound loadlock.

3. The method of claim 1 wherein:

the step of removing the wafers from the loadlock in the vacuum transfer chamber environment includes the steps of removing the first wafer from the loadlock to a holding position in the vacuum transfer chamber environment and then removing the second wafer from the loadlock.

4. The method of claim 1 further comprising the step of actively cooling wafers in the loadlock during the outbound loadlock venting step.

5. The method of claim 1 further comprising the steps of:

moving a wafer with the robot transfer device in the atmospheric front end environment and moving a wafer with the transfer arm in the high vacuum transfer chamber environment, both steps occurring when the loadlock is sealed to both the atmospheric front end environment and the high vacuum transfer chamber environment.

6. The method of claim 1 further comprising the steps of removing the first multi-wafer carrier from adjacent the robot transfer device in the atmospheric front end environment and replacing the first carrier with a second multi-wafer carrier by positioning the second carrier in communication with the atmospheric front end environment adjacent the robot transfer device, while wafers from a third carrier in communication with the atmospheric front end environment are being transferred to and from the loadlock by the robot transfer device.

7. The method of claim 1 wherein:

the steps of the process are performed with the wafers in a horizontal orientation;

the transfers of wafers into and the removal of wafers from the loadlock are carried out with substantially horizontal movements of the wafers; and the method further includes the steps of moving the wafers vertically when within a loadlock.

8. The method of claim 1 wherein:

the steps of the process are performed with the wafers in a horizontal orientation;

the transfer of wafers into and the removal of wafers from the loadlocks and into and from the processing chambers, occurring in the high vacuum environment, are carried out with substantially horizontal movements of the wafers in a first horizontal plane;

the transfers of wafers into and the removal of wafers occurring in the atmospheric environment, from the loadlock, are carried out with substantially horizontal movements of the wafers in a second horizontal plane spaced vertically from the first horizontal plane; and the method further includes the steps of moving the wafers vertically when within each of the loadlocks between the first and second horizontal planes.

9. The method of claim 1 wherein:

the step of transferring the wafers from the first carrier and into the loadlock includes the step of transferring the wafer to and from an alignment station in the atmospheric environment.

10. A method of manufacturing a semiconductor wafer comprising the steps of:

positioning a first carrier in communication with a clean atmospheric environment adjacent a robot transfer device that is located in an atmospheric front end of a semiconductor wafer processing tool; then successively transferring two wafers with the robot transfer device from the first carrier and into a two-wafer loadlock that is open to the atmospheric front end environment and sealed from the high vacuum environment of the transfer chamber; then sealing the loadlock from the atmospheric front end environment; then pumping the loadlock to a vacuum pressure level; then opening the loadlock to the high vacuum transfer chamber environment; then successively removing the wafers from the loadlock with a transfer arm located in the transfer chamber and placing the wafers into vacuum processing chambers when such chambers are in communication with the high vacuum transfer chamber environment; then processing the wafers in the processing chambers; then successively removing the wafers with a transfer arm from the vacuum processing chambers when such chambers are in communication with the high vacuum transfer chamber environment and placing the wafers into the two-wafer loadlock when the loadlock is open to the high vacuum transfer chamber environment and sealed from the atmospheric front end environment; then sealing the loadlock from the high vacuum transfer chamber environment; then venting the loadlock to a pressure level approximating the atmospheric front end environment; then opening the loadlock to the atmospheric front end environment; then successively transferring the wafers from the loadlock to the carrier with the robot transfer device in the atmospheric front end of the load.

11. A high vacuum wafer processing apparatus comprising:

- a plurality of vacuum processing chambers each having a port therein for loading and unloading wafers individually therethrough;
- a high vacuum transfer chamber having a plurality of ports in communication with the ports of the processing chambers;
- an atmospheric front end chamber in communication with an ambient atmospheric pressure environment and having at least one non-vacuum carrier loading and unloading station;
- a two-wafer loadlock chamber forming an access chamber between the high vacuum transfer chamber and the atmospheric front end chamber, the loadlock having two and not more than two wafer supports therein and thereby being configured to hold up to two wafers therein and not more than two wafers therein, a pump connected thereto to lower the pressure in the loadlock to a vacuum pressure level of the high vacuum transfer chamber and a vent connected to the ambient atmospheric pressure environment to raise the pressure of the loadlock to that of the atmospheric front end chamber;
- the loadlock being operable when the high vacuum transfer chamber is at high vacuum and the atmospheric front end chamber is at ambient atmospheric pressure, having a vacuum side closure selectively openable to connect the loadlock chamber and the high vacuum transfer chamber and having an atmospheric side closure selectively openable to connect the loadlock and the atmospheric front end chamber at ambient atmospheric pressure;
- a transfer arm in the high vacuum transfer chamber having a single wafer engaging element thereon moveable to and from each of the processing chambers and loadlock to successively transfer individual wafers thereamong; and
- an individual wafer transfer device in the front end chamber moveable among the loadlock and the at least one carrier to successively transfer individual wafers thereamong.

12. The apparatus of claim 11 further comprising:
a wafer aligner in the front end chamber;
the wafer transfer device being also moveable to and from the wafer aligner.

13. The apparatus of claim 11 further comprising:
two wafer coolers in the loadlock situated to transfer heat from the two wafers to their respective wafer coolers during venting of the loadlock.

14. The apparatus of claim 13 wherein:
the loadlock includes two upwardly facing wafer support surfaces each having a respective one of the wafer coolers therein; and
the wafer supports each including a set of at least three lift pins having a raised position whereat a wafer is situated for handoff between the respective support and the transfer arm or the transfer device and a lowered position whereat a wafer is in contact with its respective support surface.

15. The apparatus of claim 11 wherein:
the loadlock includes a wafer elevator moveable between a vacuum transfer position and an atmospheric transfer position; and the transfer arm, the ports of the processing chambers and the vacuum transfer position of the loadlock are located in a common horizontal plane.

16. The apparatus of claim 11 wherein:
the loadlock includes a wafer elevator moveable vertically between a vacuum transfer position and an atmospheric transfer position; and
the transfer device is horizontally moveable in a horizontal plane that contains the atmospheric transfer position of the loadlock.

17. The apparatus of claim 11 wherein:
the loadlock includes a wafer elevator moveable between a vacuum transfer position and an atmospheric transfer position;
the transfer arm, the ports of the processing chambers and the vacuum transfer position of the loadlock are located in a first horizontal plane; and
the transfer device is horizontally moveable in a second horizontal plane that contains the atmospheric transfer positions of the loadlock.

18. The apparatus of claim 17 wherein:
the carrier has a plurality of wafer storage positions vertically spaced in a vertical stack therein;
the carrier stations each include a carrier elevator operable to move a selected one of the plurality of wafer storage positions into the second horizontal plane; and
the transfer device is horizontally moveable in the second horizontal plane between the atmospheric transfer position of the loadlock and the selected one of the storage positions.

19. The apparatus of claim 17 wherein:
the carrier has a plurality of wafer storage positions vertically spaced in a vertical stack therein;
the transfer device being vertically moveable between the second horizontal plane to the level of a selected one of the storage positions.

20. The apparatus of claim 11 wherein:
the loadlock chamber, when closed to the atmospheric front end and high vacuum transfer chambers, encloses an evacuable volume therein substantially smaller than the volume required to contain a multiple wafer carrier.

21. The apparatus of claim 11 wherein:
the two-wafer loadlock chamber is configured to support a wafer in spaced parallel wafer support planes with the closures thereof configured for the transfer of wafers into and out of the chamber thereof in a direction perpendicular to the wafer support planes, whereby, when the wafer support planes are horizontal, the loadlock chamber is an over-under loadlock.

22. The apparatus of claim 11 wherein:
the apparatus includes a high vacuum back end section that includes the plurality of vacuum processing chambers and the high vacuum transfer chamber bounded by walls separating the vacuum environment within the back end section from an external environment; and
the loadlock chamber is mounted in a wall of the back end section with one closure thereof on the vacuum environment side of the wall and one closure on the side of the wall opposite the vacuum environment.

* * * * *